US010242430B2

(12) United States Patent
Red et al.

(10) Patent No.: US 10,242,430 B2
(45) Date of Patent: Mar. 26, 2019

(54) GRAPHICAL INTERFACE FOR COLLABORATIVE EDITING OF DESIGN SPACE MODELS

(71) Applicant: Brigham Young University, Provo, UT (US)

(72) Inventors: Walter Edward Red, Provo, UT (US);
Felicia Marshall, Lehi, UT (US);
Charles Gregory Jensen, Provo, UT (US); Prasad Weerakoon, Kiribathgoda (LK); Rob Moncur, Orem, UT (US)

(73) Assignee: Brigham Young University, Provo, UT (US)

( * ) Notice: Subject to any disclaimer, the term of this patent is extended or adjusted under 35 U.S.C. 154(b) by 111 days.

(21) Appl. No.: 13/790,556

(22) Filed: Mar. 8, 2013

(65) Prior Publication Data
US 2013/0239011 A1    Sep. 12, 2013

Related U.S. Application Data

(60) Provisional application No. 61/634,941, filed on Mar. 8, 2012, provisional application No. 61/773,855, filed on Mar. 7, 2013, provisional application No. 61/774,934, filed on Mar. 8, 2013.

(51) Int. Cl.
*G06T 5/00*    (2006.01)
*G06F 17/50*   (2006.01)

(52) U.S. Cl.
CPC .............. *G06T 5/00* (2013.01); *G06F 17/50* (2013.01)

(58) Field of Classification Search
None
See application file for complete search history.

(56) References Cited

U.S. PATENT DOCUMENTS

| 6,094,658 | A | * | 7/2000 | Araki | G06F 17/50 |
| 6,100,896 | A | * | 8/2000 | Strohecker | G06T 15/10 |
| | | | | | 345/419 |
| 7,110,842 | B2 | * | 9/2006 | Angelo | G06F 17/50 |
| | | | | | 700/103 |

(Continued)

FOREIGN PATENT DOCUMENTS

EP    1939772 A1    7/2008

OTHER PUBLICATIONS

Chen et. al, "Internet-enabled real-time collaborative assembly modeling via an e-Assembly system: status and promise", dated Oct. 12, 2003, Computer-Aided Design 36 (2004) 835-847.*

(Continued)

*Primary Examiner* — Shourjo Dasgupta
(74) *Attorney, Agent, or Firm* — Kunzler, PC

(57) ABSTRACT

A method for collaborative CAx editing may include enabling a user to define a partitioning constraint for a design space and partitioning the design space into editing regions according to the partitioning constraint and assigning users to specific editing regions. The method may also include displaying a feature tree, enabling a user to select and lock a selected feature for editing by a specified user, enabling the specified user to edit the selected feature and blocking access from other users to the selected feature. An apparatus corresponding to the above method is also disclosed herein.

12 Claims, 13 Drawing Sheets

(56) References Cited

U.S. PATENT DOCUMENTS

| | | | | |
|---|---|---|---|---|
| 7,143,136 B1* | 11/2006 | Drenan | G06Q 10/06 | 709/204 |
| 7,149,959 B1* | 12/2006 | Jones | G06Q 10/06 | 715/234 |
| 7,176,942 B2* | 2/2007 | Chartier | G05B 19/41805 | 345/619 |
| 7,587,695 B2* | 9/2009 | Petunin | G06F 17/5068 | 703/20 |
| 7,707,505 B1* | 4/2010 | Ohrt | G06F 17/30893 | 715/738 |
| 7,818,679 B2* | 10/2010 | Clarke | H04L 67/38 | 709/201 |
| 7,840,596 B2* | 11/2010 | Geyer | G06Q 10/10 | 707/790 |
| 2005/0213823 A1* | 9/2005 | Ito | G06F 17/50 | 382/205 |
| 2006/0117012 A1* | 6/2006 | Rizzolo | G06Q 10/06 | |
| 2006/0250418 A1* | 11/2006 | Chartier | G05B 19/41805 | 345/619 |
| 2007/0091119 A1* | 4/2007 | Jezyk et al. | | 345/619 |
| 2007/0208994 A1* | 9/2007 | Reddel | G06F 17/2288 | 715/205 |
| 2007/0265727 A1* | 11/2007 | Bae | G06F 17/50 | 700/182 |
| 2008/0046828 A1* | 2/2008 | Bibliowicz | G06Q 10/10 | 715/751 |
| 2008/0077891 A1* | 3/2008 | Dooling | G06F 17/5081 | 716/52 |
| 2009/0115796 A1* | 5/2009 | Weese | G06T 19/20 | 345/619 |
| 2010/0042377 A1* | 2/2010 | Seroussi | G06F 17/5004 | 703/1 |
| 2010/0083136 A1* | 4/2010 | Komine | G06F 9/52 | 715/753 |
| 2010/0121614 A1* | 5/2010 | Reghetti | G06T 19/00 | 703/1 |
| 2011/0145760 A1* | 6/2011 | Radet | G06F 3/04815 | 715/810 |
| 2012/0317497 A1* | 12/2012 | Red et al. | | 715/751 |
| 2013/0239011 A1* | 9/2013 | Red et al. | | 715/743 |

OTHER PUBLICATIONS

"Collaborative computer-aided design—research and development status Original Research Article Computer-Aided Design", vol. 37, Issue 9, Aug. 2005, pp. 931-940 W.D. Li, W.F. Lu, J.Y.H. Fuh, Y.S. Wong ("Li").*

Cera, "Hierarchical Role-Based Viewing" 2006.*

Red, "v-CAx: A Research Agenda for Collaborative Computer-Aided Applications" 2010.*

J.Y. Chen et al., "Collaborative Design Environment with Multiple CAD System", Computer-Aided Design & Applications, 2005, vol. 2, Nos. 1-4, pp. 367-376.

PCT/US2013/029952, International Preliminary Report on Patentability, dated Sep. 18, 2014.

Min Li et al., "A Fine Granular Concurrency Control Mechanism for a Peer-to-Peer Cooperative Design Environment", Proceedings of the 2007 11th International Conference on Computer Supported Cooperation Work in Design, pp. 180-185.

L. Yang et al., "Coordination for Replicated Collaborative Feature Modeling", International Journal on Interactive Design and Manufacturing, vol. 4, No. 3, Aug. 2010, pp. 191-200.

Felicia Diane Marshall, "Model Decomposition and Constraints to Parametrically Partition Design Space in a Collaborative CAx Environment", http://scholarsarchive.byu.edu/etd, BYU ScholarsArchive, Dec. 12, 2011.

Min Li et al., "Replicated Concurrency Control for Collaborative Feature Modelling: A Fine Granular Approach", ScienceDirect, Compuers in Industry, 59, 2008, pp. 873-881.

* cited by examiner

GRAPHICAL INTERFACE FOR COLLABORATIVE EDITING OF DESIGN SPACE MODELS

RELATED APPLICATIONS

This application claims the benefit of U.S. Provisional Application 61/634,941 entitled "MULTI-USER DECOMPOSITION OF DESIGN SPACE MODELS" and filed on 8 Mar. 2012 for W. Edward Red, Felicia Marshal, C. Gregory Jensen, Prasad Weerakoon and Rob Moncur, and of U.S. Provisional Application 61/773,855 entitled "MULTI-USER DECOMPOSITION OF DESIGN SPACE MODELS" and filed on 7 Mar. 2013 for Walter Edward Red, Felicia Marshal, Charles Gregory Jensen, Prasad Weerakoon and Rob Moncur and of U.S. Provisional Application 61/774,934 entitled "MULTI-USER METHODS FOR FEA PREPROCESSING" and filed on 8 Mar. 2013 for Walter Edward Red, Prasad Weerakoon, Charles Gregory Jensen, Steven E. Benzley, Karl Merkley, James Wu and Chia-Chi Teng. The aforementioned applications are incorporated herein by reference in their entirety.

BACKGROUND OF THE INVENTION

Field of the Invention

The claimed invention relates to computer aided technologies (CAx) such as computer aided design, engineering, analysis and manufacture in general, and means and methods for collaborative CAx in particular.

Description of the Related Art

Currently available CAx applications typically require that a single user assume ownership and control of a design or engineering model (e.g. a file or database record) in order to prohibit multiple users from making uncoordinated changes to the model.

BRIEF SUMMARY OF THE INVENTION

The present invention has been developed in response to the present state of the art, and in particular, in response to the problems and needs in the art that have not yet been fully solved by currently available CAx apparatus and methods. Accordingly, the claimed inventions have been developed to provide collaborative CAx apparatii and methods that overcome shortcomings in the art.

As detailed herein, a method for collaborative CAx editing may include enabling a user to define a partitioning constraint for a design space, partitioning the design space into editing regions according to the partitioning constraint, enabling the user to reserve a selected editing region for editing by a specified user, enabling the specified user to edit features associated with the selected editing region and blocking access from other users to features associated with the selected editing region. The selected editing region may or may not be spatially contiguous.

The partitioning constraint may be any appropriate form of constraint such as an equation, a geometry list, a feature selection filter and a partitioning surface. A partitioning surface may be planar surface, a curved surface, an open surface, a closed surface, and the surface (in whole or in part) of a three dimensional shape such as a block, a cylinder, a cone, a conical frustum and an ellipsoid. The partitioning surface may be substantially closed and the user may specify the interior or the exterior of the partitioning surface as the selected editing region.

Another method for collaborative CAx editing includes enabling a user to specify one or more selected geometries associated with an engineering object, enabling the user to assign a specified user for the selected geometries, enabling the specified user to edit the selected geometries and features associated therewith, and blocking access from other users to the selected geometries and the features associated therewith. Enabling a user to specify the selected geometries may include presenting a list of geometries, providing a selection filter interface, responding to mouse events proximate to geometries, and the like.

Another method for collaborative CAx editing includes displaying a feature tree for an engineering object, enabling a user to select and lock (via the feature tree) a selected feature for editing by a specified user, enabling the specified user to edit the selected feature, and blocking access from other users to the selected feature. In one embodiment, icons for reserving, locking and releasing a selected feature are displayed adjacent to a node in the feature tree that corresponds to the selected feature.

Yet another method for collaborative CAx editing includes displaying a feature tree for an engineering object, enabling a user to associate a specified constraint with a selected feature via the feature tree and constraining editing of the selected feature by users according to the specified constraint. The specified constraint may include a numerical limit, an equation, a function or the like.

Apparatii corresponding to the above methods are also disclosed herein. It should be noted that references throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

The described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
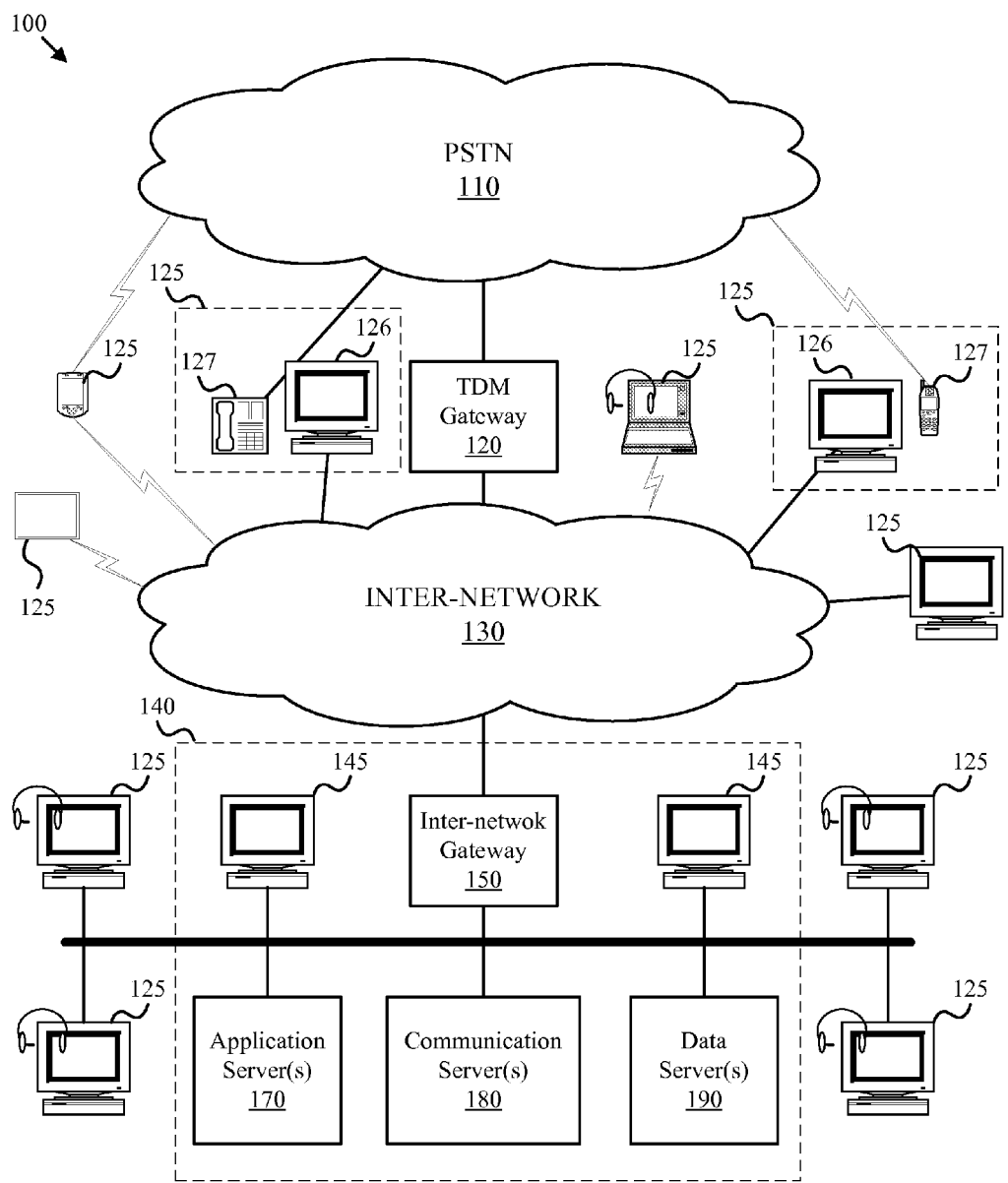
FIG. 1 is a block diagram of one example of a computing and communications infrastructure that is consistent with one or more embodiments of the claimed invention.

Some of the functional units described in this specification have been labeled as modules, in order to more particularly emphasize their implementation independence. Others are assumed to be modules. For example, a module or similar unit of functionality may be implemented as a hardware circuit comprising custom VLSI circuits or gate arrays, off-the-shelf semiconductors such as logic chips, transistors, or other discrete components. A module may also be implemented with programmable hardware devices such as field programmable gate arrays, programmable array logic, programmable logic devices or the like.

A module or a set of modules may also be implemented (in whole or in part) as a processor configured with software to perform the specified functionality. An identified module may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, the executable code of a module may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any tangible form capable of enabling execution of a program of machine-readable instructions on a digital processing apparatus. For example, a computer readable medium may be embodied by a flash drive, compact disk, digital-video disk, a magnetic tape, a Bernoulli drive, a magnetic disk, a punch card, flash memory, integrated circuits, or other digital processing apparatus memory device. A digital processing apparatus such as a computer may store program codes, associated data, and the like on the computer readable medium that when retrieved enable the digital processing apparatus to execute the functionality specified by the modules.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

As used herein the phrase 'engineering object' refers to an electronically modeled object that may be edited by a CAx application or tool and 'CAx model' refers to the electronic model for that object. CAx applications and tools include, but are not limited to, design tools, meshing tools, simulation tools, visualization tools, analysis tools, manufacture planning tools, and manufacture simulation tools.

FIG. 1 is a block diagram of one example of a computing and communications infrastructure 100 that is consistent with one or more embodiments of the claimed invention. As depicted, the infrastructure 100 includes various systems, subsystems, and networks such as a public switched telephone network (PSTN) 110, a TDM gateway 120 connecting the PSTN to an inter-network 130, a variety of workstations 125, a data center 140 with administrative terminals 145, an inter-network gateway 150 connecting a local area network to the inter-network 130, and various servers such as application servers 170, communication servers 180, and data servers 190. The infrastructure 100 is one example of components that can be operably interconnected to provide an infrastructure for a collaborative CAx system.

Each workstation 125 may include a separate computing device 126 and a communications device 127 or the computing device and communications device may integrated into the workstation 125. The computing devices 126 may enable graphical editing and viewing of CAx models. The communications devices 127 may enable users to communicate with other users that are concurrently editing a CAx model.

The inter-network 130 may facilitate electronic communications between the various workstations and servers. In one embodiment, the inter-network 130 is the internet. In another embodiment, the inter-network 130 is a virtual private network (VPN).

Various servers such as blade servers within the data center 140 function cooperatively to facilitate concurrent collaborative editing of CAx models by local and remote users. For example, the application servers 170 may provide one or more collaborative CAx applications to the local and remote users. Some users may have the collaborative CAx applications installed on their local computing devices 126.

The communication servers 180 may facilitate communications between the users through various channels or services such as VOIP services, email services, instant messaging services, short message services, and text messaging services. The workstations 125 may leverage such services for user to user communications via the communication servers 180 or via other available service platforms.

The data servers 190 or the like may store CAx models of design or engineering objects within various model files or records. The data servers may replicate copies of the models for use by various users. Some users may have a local copy of a model. As described herein, instead of requiring a particular user to assume control of a model file or record, updates to the model may be coordinated by one or more collaborative CAx applications including client versions, server versions, and cloud versions of such applications.

Figure 2:
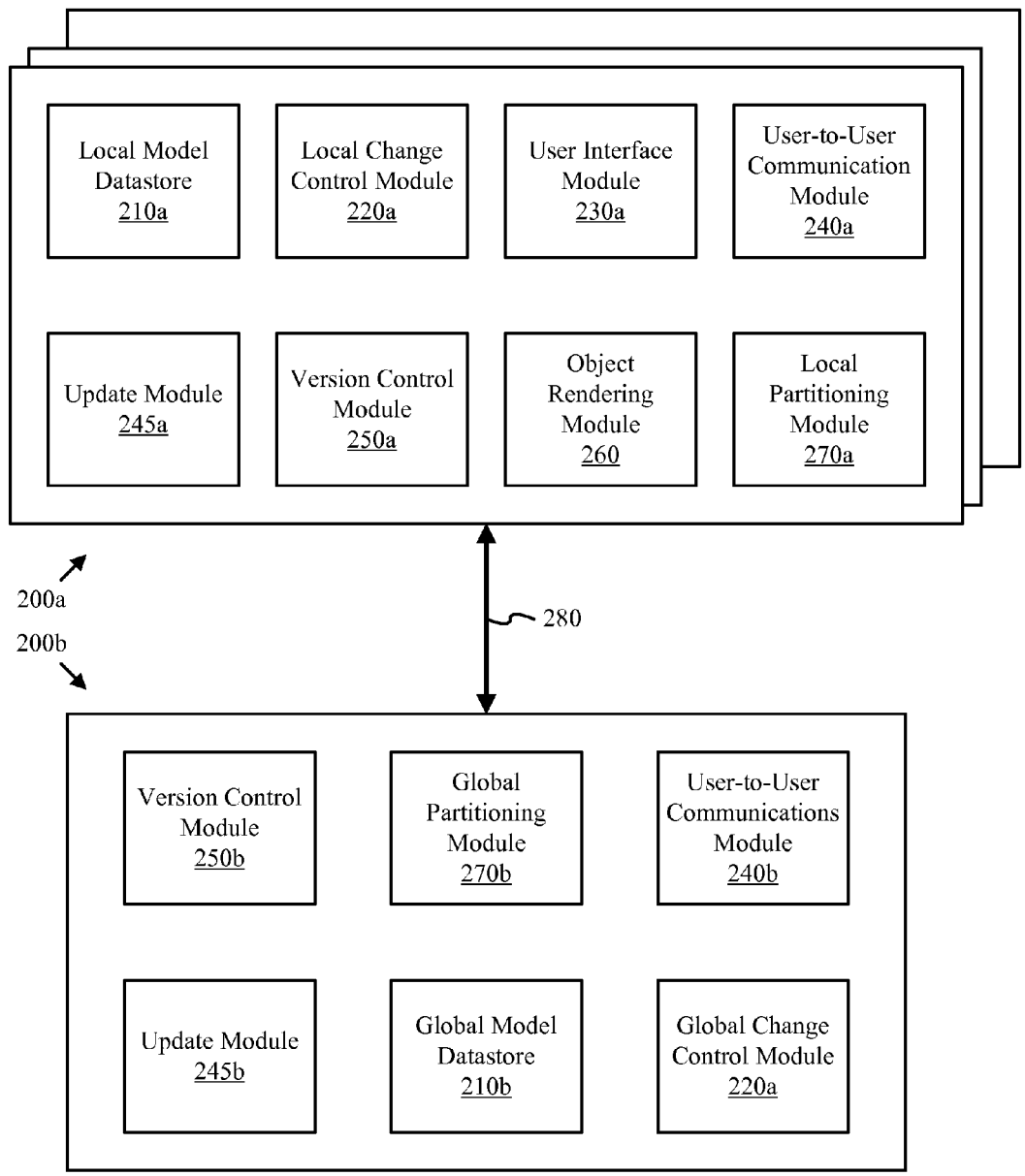
FIG. 2 is a block diagram of one example of a collaborative CAx editing system that is consistent with one or more embodiments of the claimed invention.

FIG. 2 is a block diagram of one example of a collaborative CAx editing system 200 that is consistent with one or more embodiments of the claimed invention. As depicted, the collaborative CAX editing system 200 includes a variety of modules including a model datastore 210, a change control module 220, a user interface module 230, a user-to-user communication module 240, a version control module 250, an object rendering module 260, and a partitioning module 270. Each of the modules may reside on a single computing device (i.e. node) or be collaboratively partitioned onto multiple devices or nodes. For example, the depicted embodiment includes a client node 200a where the various modules are appended with the reference letter 'a' and a server node 200b where the modules are appended with the reference letter 'b'. The modules may be primarily or wholly comprised of software codes and associated data that are executed and processed by a digital processing apparatus such as a computer to provide the specified functionality.

The model datastore 210 stores data for the node(s) 200. The model datastore 210 may include an actual storage device or act as an interface to a storage device. In particular, the model datastore 210 may enable the nodes 200 to store and retrieve files or other units of data such as database records that correspond to an electronic model (i.e. CAx model) of an engineering object. The model datastore 210 may include working memory on the node 200.

In one embodiment, the local model datastore 210a contains local copies of CAx models managed by the global model datastore 210b. The local and global model datastores may coordinate together to provide data coherency between local copies of the CAx models and the global copy. In certain embodiments, the global model datastore is a redundant and/or a distributed storage system.

The change control module 220 controls user access to data managed by the model datastore 210. In one embodiment, the change control module 220 ensures that users can only access data that corresponds to geometries and features within an editing region that has been assigned to the user. All other users may be blocked by the change control module 220 from accessing data corresponding to features within the editing region that has been assigned to that user. In another embodiment, any user may change a feature as long as that feature or region has not been assigned to another user.

Examples of features include the shape, dimensions, composition, material properties and tolerances of an object, the mesh size and required accuracy for simulations, the path and tolerances for a manufacturing tool, and any other attribute that may affect the performance of a product and the manufacture thereof.

The change control module 220 may also block an update to a CAx model if the changes to an editable feature violate engineering constraints associated with the modeled engineering object. For example, if changing the material of a particular component results in an increase in mass for the engineering object beyond a designated threshold, the change to the material may be blocked by the change control module 220. Constraints may be specified as limiting values, allowable values, equations, functions or the like.

The user interface module 230 provides a user with a variety of interface elements that facilitate concurrent collaborative editing. Examples of such interface elements include interfaces elements for displaying a feature tree, defining a partitioning surface or equation, selecting, reserving, assigning, locking and releasing geometries, editing regions and features, specifying a feature constraint, selecting and editing geometries, displaying a list of concurrent users, displaying user identifiers proximate to assigned editing regions, presenting a list or other view of geometries and/or features, prioritizing user access rights and priorities (e.g. by a project leader), selecting user-to-user communication channels, initiating communication with another user, and providing access to software tools corresponding to various stages or layers associated with an engineering object. The user interface module 230 may also respond to mouse events, keyboard events, and the like.

The user-to-user communication module 240 facilitates direct communication between users. The user-to-user communication module 240 may leverage a variety of communication services such as those detailed above in the description of the computing and communications infrastructure 100. Communication may be between concurrent users as well as users that may not be actively editing an object. The interface elements provided by the user interface module 230 may enable a user to select particular users or groups as a target for a particular message or ongoing conversation. Such communication is enabled by the user-to-user communication module 240.

The update module 245 propagates changes to editable features between nodes of the collaborative editing system. The changes may be communicated via one or more communication channels 280 such as peer-to-peer communication channels, client-server communication channels, and data replication channels associated with a cloud computing environment. In the depicted embodiment, valid changes to a local copy of an engineering model are communicated by the client update module 245a to the server update module 245b within the server node 200b. In turn, the server update module 245b may update additional client nodes 200a.

One of skill in the art will appreciate that the granularity and frequency of updates may be a factor in how frequently a user may be blocked from editing a feature or geometry. For example, frequent updates of relatively small regions may enable multiple users to sequentially gain access to a common working region and thereby reduce the probability of blocking. In one embodiment, an editing region is released for access by any user when the changes to a feature or geometry are propagated to other nodes.

The version control module 250 provides revision control capabilities to the collaborative editing environment. For example, the version control module in conjunction with the user interface module may enable the concurrent users to select which revision of a product is to be updated with the edits. In certain embodiments, multiple revisions may be simultaneously edited. Revision control may also allow the collaborative users to discard edits associated with an editing session.

The object rendering module 260 renders the engineering object on a display for viewing by the user. The user interface module 230 may overlay interface elements such as control points on the rendered engineering object.

The partitioning module 270 partitions the engineering object into one or more editing regions. The partitioning may occur via spatial decomposition. The partitioning may be automatic, for example when an engineering object is opened for editing, or user driven, for example in response to a user selecting a region or particular elements or features for editing. In some embodiments, the partitioning module 270 partitions the design space and/or the engineering object into a plurality of editing regions by using a partitioning constraint provided by the user.

Figure 7:
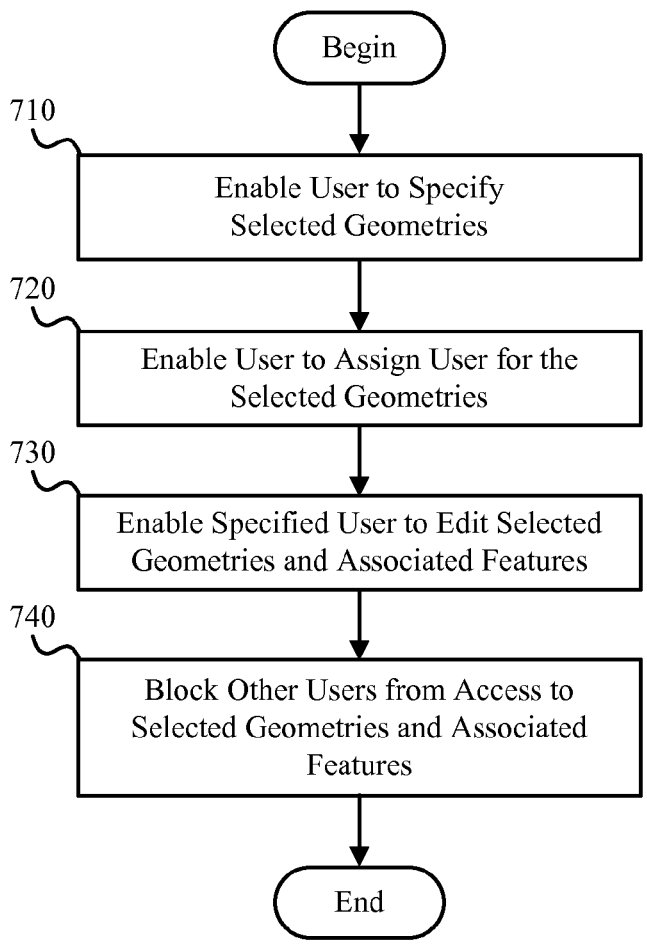
FIG. 7 is a flowchart diagram of a geometry decomposition method consistent with embodiments of the claimed invention.
Figure 8:
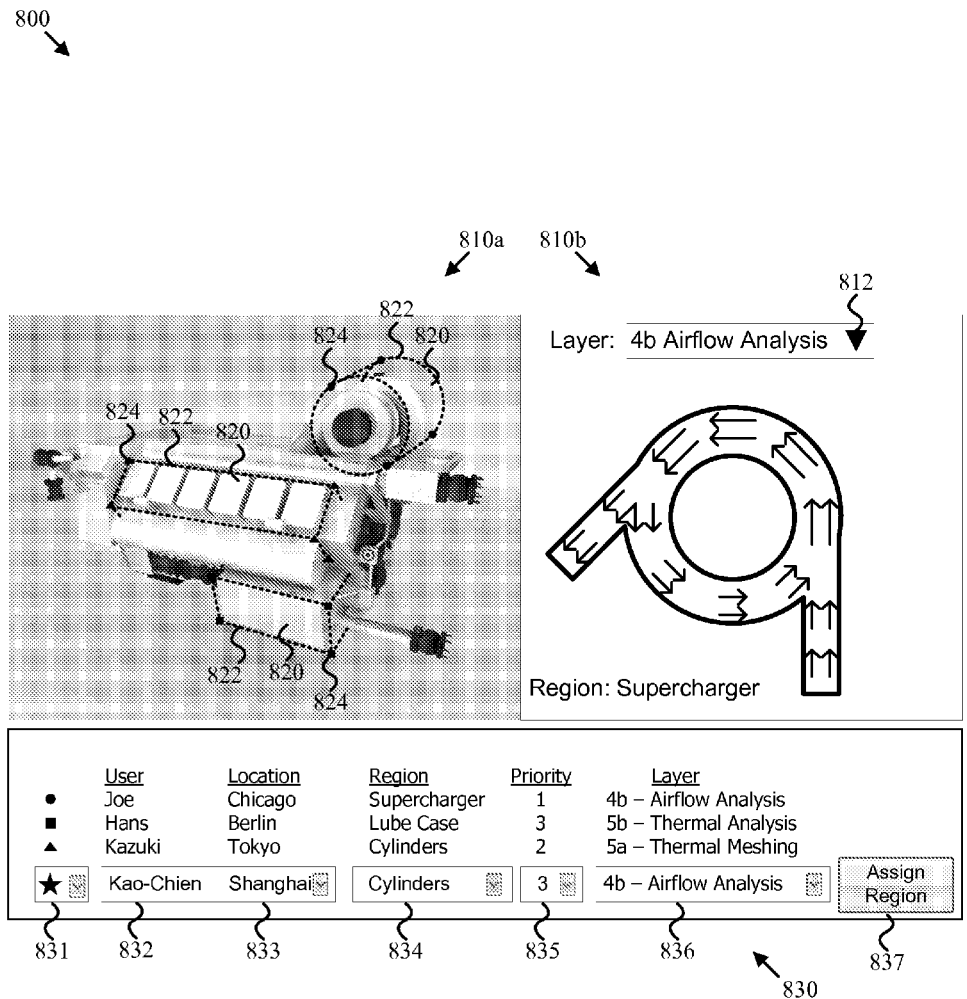
FIG. 8 is a graphical and textual depiction of one example of a geometry assignment user interface that may be used in conjunction with the geometry decomposition method depicted in FIG. 7 and other methods describe herein.

In some embodiments, the local partitioning modules 270a initiate the partitioning process but the actual partitioning is performed by the global partitioning module 270b or a process under control of the global partitioning module 270b. Specific user-driven partitioning methods are shown in FIGS. 7 and 8 and described in the associated description.

Figure 3A:
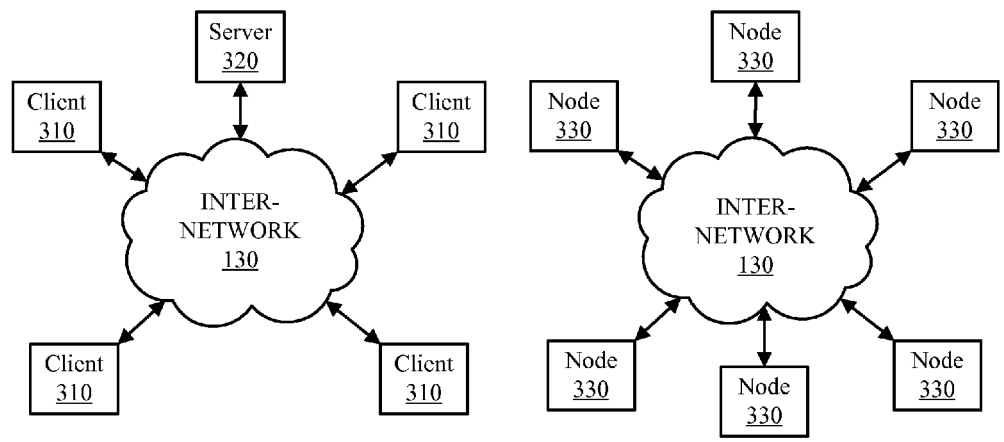
FIGS. 3a-3c are block diagrams of several embodiments of the collaborative CAx editing system of FIG. 2 as applied to various computing architectures.
Figure 3B:
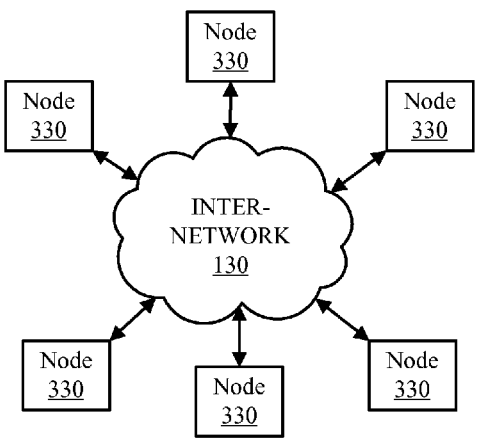
Figure 3C:
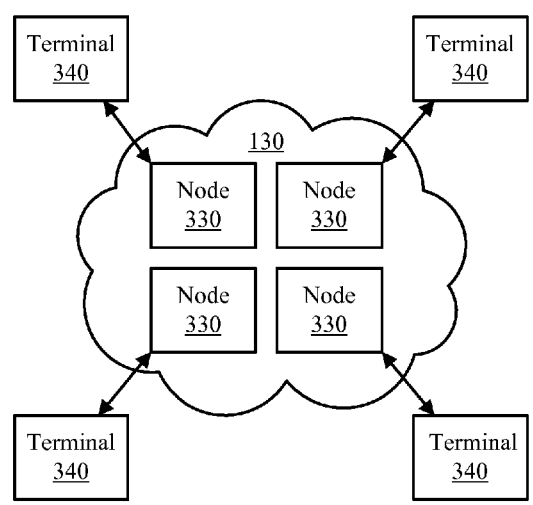

FIGS. 3a-3c are block diagrams of several embodiments of the collaborative CAx editing system of FIG. 2 as applied to various computing architectures. FIG. 3a depicts one example of a client-server embodiment, FIG. 3b depicts one example of a peer-to-peer embodiment, and FIG. 3c depicts one example of a cloud embodiment. It should be noted that a variety of computing architectures beyond those shown in FIGS. 3a-3c including emerging architectures may provide a computing infrastructure suitable for the collaborative CAx editing disclosed herein.

The client-server embodiment depicted in FIG. 3a includes a number of collaborative editing clients 310 that are in communication with a collaborative editing server 320. In one embodiment, the client 310 is the node 200a depicted in FIG. 2 and the server 320 is the node 200b. However, one of skill in the art will appreciate the modules shown in FIG. 2 may be partitioned between the client 310 and the server 320 in any useful manner that facilitates collaborative editing.

The peer-to-peer embodiment depicted in FIG. 3b includes a number of collaborative editing nodes 330. In the depicted embodiment, each collaborative editing node includes all of the modules of the client node 200a along within distributed versions of the modules of the server node 200b. In another embodiment, each module of the server node 200b is assigned to a particular collaborative editing node 330.

Figure 4:
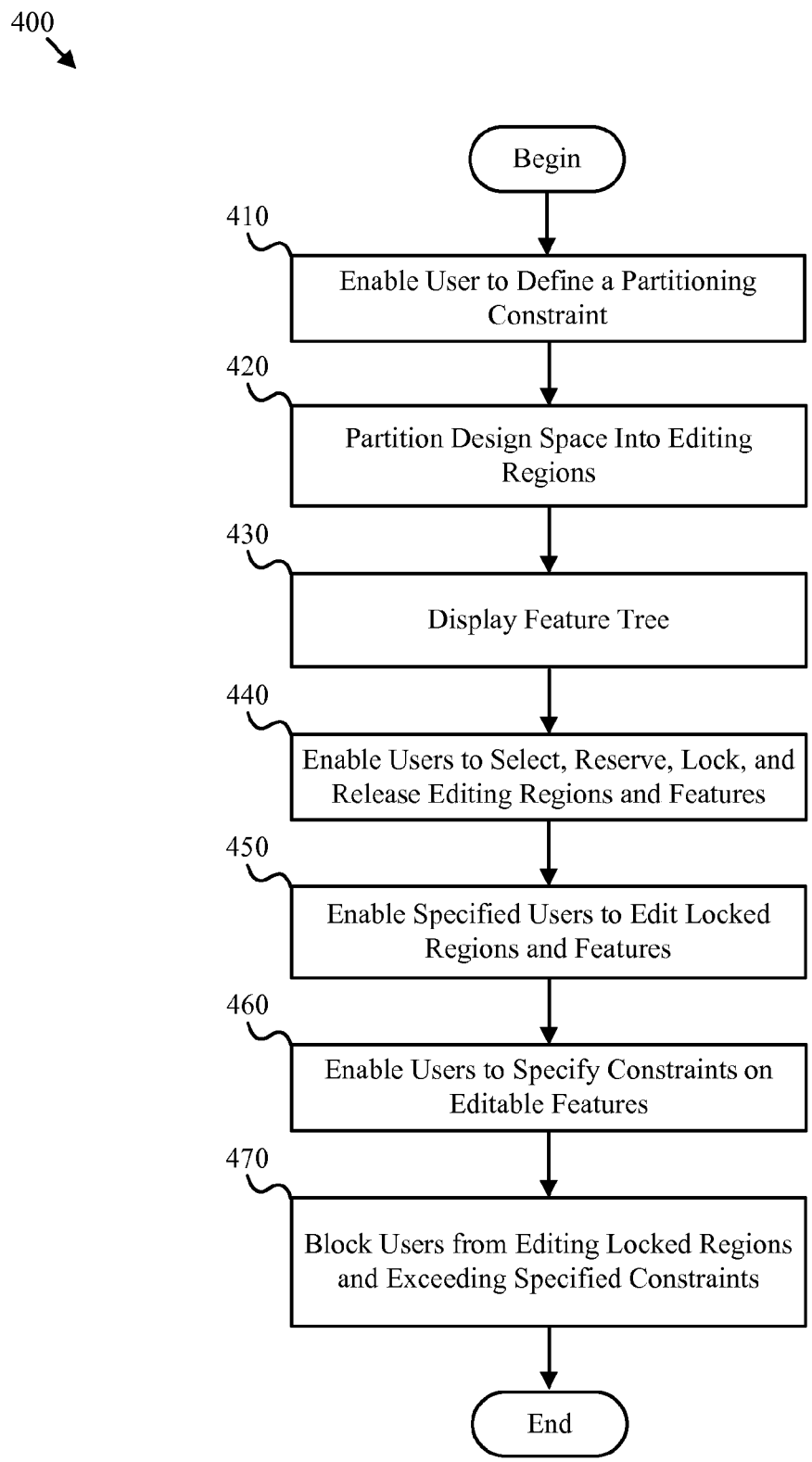
FIG. 4 is a flowchart diagram of one example of a collaborative CAx editing method that is consistent with one or more embodiments of the claimed invention.

The cloud embodiment depicted in FIG. 3c includes a number of collaborative editing nodes 330 similar to the peer-to-peer embodiment of FIG. 4. However, the collaborative editing nodes may be part of the inter-network 130 or one or more data centers 140 attached to the inter-network 130. In the depicted embodiment, users access a collaborative CAx application via a collaborative editing terminal 340. In one embodiment, the collaborative editing terminal 340 is a thin client that only includes the modules of FIG. 2 (or portions thereof) that are necessary to support user interaction.

FIG. 4 is a flowchart diagram of one example of a collaborative CAx editing method 400 that is consistent with one or more embodiments of the claimed invention. As depicted, the collaborative CAx editing method 400 includes enabling 410 a user to define a partitioning constraint, partitioning 420 a design space into editing regions, displaying 430 a feature tree, enabling 440 users to select, reserve, lock and release editing regions and features, enabling 450 specified users to edit locked regions and features, enabling 460 users to specify constraints on editable features and blocking 470 users from editing locked regions and exceeding specified constraints.

Enabling 410 a user to define a partitioning constraint may include enabling the user to specify an equation, a geometry list, (criteria for) a feature selection filter, a partitioning surface that can guide the partitioning process. For example, a feature selection filter may specify specific constraints such as "find solid geometries with a fillet".

A partitioning surface may be specified via conventional CAx input methods such as entering control points, specifying parameters for a geometry or specifying a tool path and associated tool. The partitioning surface may correspond to a variety of shapes or geometries. For example, the partitioning surface may be a planar surface, a curved surface, an open surface, a closed surface, or the surface of a three dimensional shape (in part or whole) such as a block, a cylinder, a cone, a conical frustum and an ellipsoid.

Partitioning 420 a design space into editing regions may include sorting and/or cutting an engineering object and/or geometries and features associated therewith into features, parts or regions that meet the specified constraints. The partitioned features, parts or regions may then be independently reserved and assigned to one or more users.

Displaying 430 a feature tree may include displaying various geometries and elements used to define the engineering object and various attributes associated therewith such as the shape, dimensions, composition, material properties and tolerances of the geometry.

Enabling 440 users to select, reserve, lock and release editing regions and features may include providing interface elements that facilitate selecting, reserving, locking (i.e. assigning) and releasing editing regions. In one embodiment, enabling 450 specified users to edit locked regions and features includes allowing only users that have locked (i.e. been assigned to) a region or particular feature to edit (features within) that region or that particular feature. In another embodiment, any user may edit features within a region or a specific feature as long as that region or feature has not been assigned to another user.

Enabling 460 users to specify constraints on editable features may include displaying edit controls that enable a user to enter constraint equations or limiting values on features. The edit controls may be separate from, or integrated with, the feature tree. Blocking 470 users from editing locked regions and/or features and exceeding specified constraints may include enforcing locks on regions and features and constraints on features.

FIGS. 5-13 focus on specific aspects of, and interfaces for, the collaborative CAx editing method 400. It should be noted that large collaborative CAx projects require coordination and control of the activities of potentially hundreds to thousands of engineers and designers. Such projects have been managed by such means as deconstructing the engineering object into components and subcomponents that are designed, engineered, and manufactured independently, leading to component incompatibilities; or by partitioning the subassembly design process in phases over time, leading to longer development times; or by attempting to manage synchronous design processes by rule and policy, which often leads to corruption of the CAx database or lost work when multiple users mistakenly edit features concurrently. Various aspects of the collaborative CAx editing method 400 that address these issues were introduced in FIG. 4 and are shown in greater detail in FIGS. 5-13.

Figure 5:
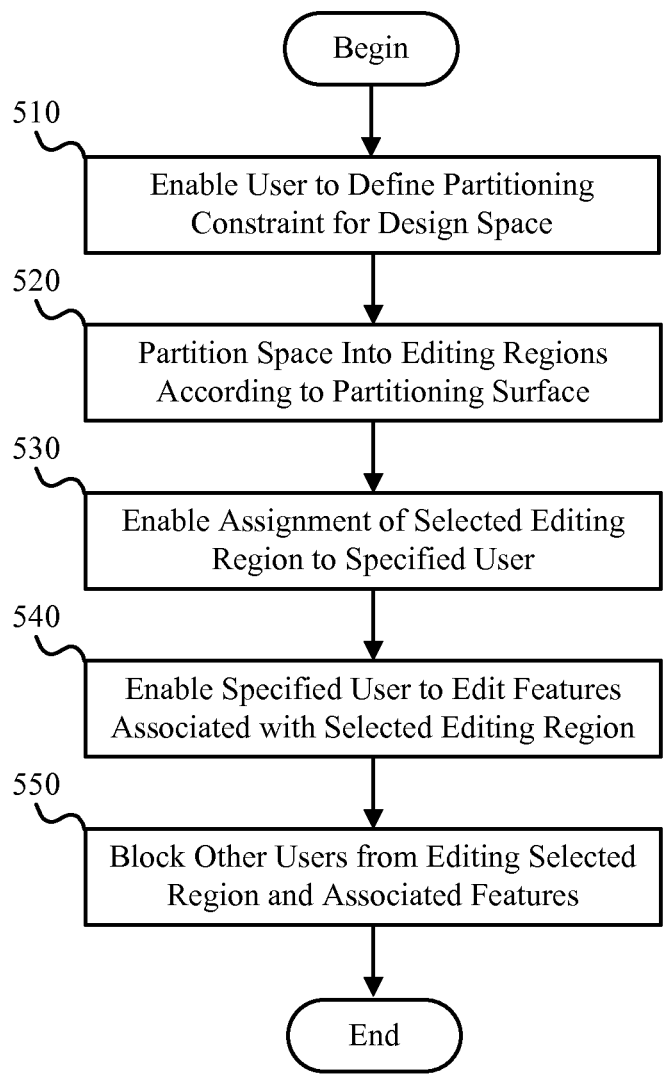
FIG. 5 is a flowchart diagram of one example of a design space decomposition method that is consistent with one or more embodiments of the claimed invention.

FIG. 5 is a flowchart diagram of one example of a design space decomposition method 500 that is consistent with one or more embodiments of the claimed invention. As depicted, the design space decomposition method 500 includes enabling definition 510 of a partitioning constraint, partitioning 520 the design space into editing regions, enabling assignment 530 of a selected editing region, enabling feature editing 540 of a selected editing region, and blocking editing 550 of an editing region and associated features.

Enabling definition 510 of a partitioning constraint may include any of the methods described in the enabling step 410. For example, enabling definition 510 of a partitioning constraint may include providing CAx graphic user interface tools or selection filters for selecting features or geometries of an engineering object. A partitioning surface may also be defined as components of an engineering object are constructed. Enabling definition of partitioning constrains may be coordinated by the local partitioning module 220*a*, employing the user interface module 230*a* and object rendering module 260 to facilitate identification of the partitioning surface.

Partitioning 520 the engineering object into editing regions may include local or remote invocation of one or more functions that identify structures in a CAx database corresponding to partitioning constraint. In some embodiments, regions are automatically generated. In other embodiments, regions are established in response to users selecting specific geometries or features for editing. In such embodiments, the local partitioning module 270*a* or global partitioning module 270*b* may check dependencies between geometries and features and allocate one or more spatial regions that encompasses all of the geometries (or the like) affected by a change to a feature. For example, an engineering object may have mounting holes for securing the object within a product. Editing a mounting hole spacing parameter or feature for the engineering object may cause the partitioning module 270 to allocate one or more editing regions (to the collaborative user) that encompasses each geometry affected by the hole spacing.

Enabling assignment 530 of a selected editing region may include providing user interface controls for selecting users from a plurality of available users, selecting editing regions from a plurality of defined editing regions, and assigning access to the selected editing region and associated features to the selected user. In one embodiment, assignment of editing regions is established by an access privileges administrator such as a project coordinator. In certain embodiments, assignment of editing regions is established in response to the user selecting a feature for editing via one or more interface elements associated with a feature tree. In one embodiment, icons for reserving, locking and releasing features are displayed proximate to features in the feature tree.

Enabling feature editing 540 of a selected editing region may include providing a user interface for inspecting and modifying features associated with the selected region. User access to features may be graphically represented by displaying features in various colors, with background patterns or shading, or marked by icons indicating whether the user is permitted access to change the features.

Blocking editing 550 of an editing region and associated features may include allowing users to make changes to features within editing regions assigned to them while preventing users from making changes to features within editing regions that are not assigned to them. In one embodiment, user access to features may be blocked by not providing interface controls for editing the features. In another embodiment, a warning may be displayed when the user attempts to modify a feature to which access has not been assigned to the user.

Figure 6:
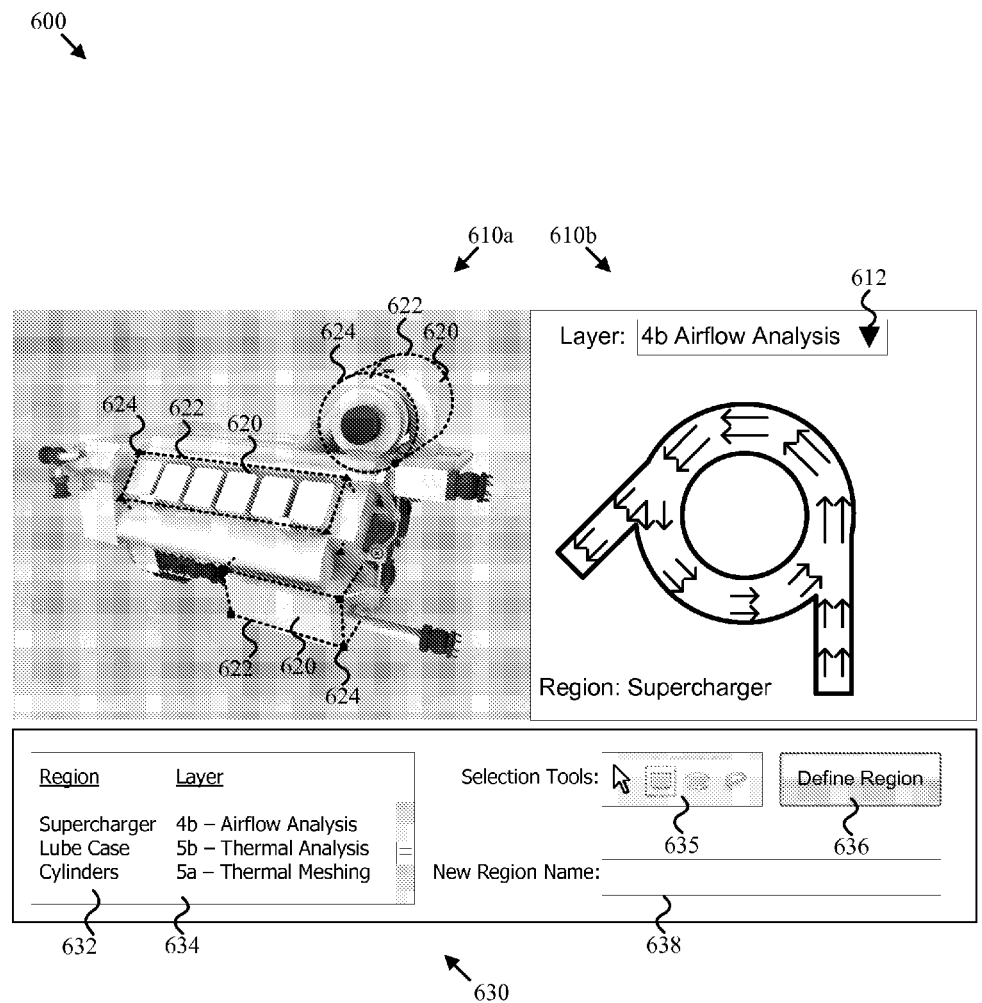
FIG. 6 is a graphical and textual depiction of one example of a design space decomposition user interface that may be used in conjunction with embodiments of the collaborative design space decomposition method depicted in FIG. 5 and other methods describe herein.

FIG. 6 is a graphical and textual depiction of one example of a design space decomposition user interface 600 in conjunction with embodiments of the collaborative design space decomposition method of the claimed invention. As depicted, the design space decomposition user interface 600 includes a graphical rendering 610 with design space definition regions 620 and region definition toolbox 630. The design space decomposition user interface 600 facilitates decomposing a design space into defined editing regions for collaborative user editing of electronic models of engineering objects.

The graphical rendering 610 provides a graphical rendering of an engineering object and/or layer associated therewith. The graphical rendering may be a 2D or 3D rendering from a variety of perspectives that facilitates editing. In the depicted embodiment, the graphical rendering includes a perspective CAD rendering 610*a* and a cross-sectional analysis rendering 610*b* for a region.

The editing regions 620 may be demarcated with boundaries 622 and 624 that indicate generally the extents of the selected region. Although not depicted, the spatial decomposition process may result in spatially disjoint regions, or regions whose extents do overlap. For example, an electronic model for an airplane may be partitioned into a cabin interior region, a fuselage exterior region, and a region for the aircraft wings. In some embodiments, graphical renderings within each region are color coded or coded in some other way such as a shading pattern to indicate the extent of the editing regions.

In the depicted embodiment, a layer selector 612 (e.g. a drop-down list) enables a collaborative user to select the layer that is to be decomposed or viewed for an editing region. Software tools that are specific to the selected layer (not shown) may be made available or activated on the user interface 600 in response to layer selection. Examples of such software tools include visualization tools, design tools, analysis tools, and manufacture planning tools.

The region definition toolbox 630 may provide a variety of information and region selection tools relative to defining editing regions, such as a list of defined region names 632 and associated layers 634, selection tools 635 for selecting geometries in the design space for designation as editing regions, and region designation controls 636 and 638 to indicate when a new editing region has been defined, and to assign an associated identifier. The region name 632 may be derived from information within the electronic model or specified by a user upon assignment or selection.

FIG. 7 is a flowchart of a geometry decomposition method 700. As depicted, the geometry decomposition method 700 includes enabling 710 a user to specify one or more selected geometries, enabling 720 the user to assign a specified user, enabling 730 the specified user to edit the selected geometries, and blocking 740 other users from access to the selected geometries. The method 700 may enable coordinated collaborative editing without requiring rigid administrative control. One of skill in the art will appreciate that the method 700 and other methods disclosed herein could be applied to groups of users as well as individual users.

Enabling 710 a user to specify one or more selected geometries may include a variety of methods such as presenting a list of geometries that the user can select, providing a selection filter interface and responding to mouse events proximate to geometries. Enabling 720 the user to assign a specified user may include presenting a list of users that the user can selected from and providing a search dialog. For example, the user could search for users with specific skills or experience.

Enabling 730 the specified user to edit the selected geometries may include responding to changes to features associated with the selected geometries. Blocking 740 other users from access to the selected geometries may include preventing access to features associated with the selected geometries or preventing updates to those features.

FIG. 8 is a graphical and textual depiction of one example of a geometry assignment user interface 800 that is consistent with one or more embodiments of the claimed invention. As depicted, the geometry assignment user interface 800 includes a graphical rendering 810 with design space display regions 820 and region assignment tools 830. The geometry assignment user interface 800 facilitates assignment of defined editing regions to users for collaborative editing of electronic models of engineering objects.

The graphical rendering 810 provides a graphical rendering of an engineering object and/or layer associated therewith. In the depicted embodiment, the graphical rendering includes a perspective CAD rendering 810*a* and a cross-sectional analysis rendering 810*b*, similar to the graphical rendering 610 in the design space decomposition user interface 600.

The editing regions 820 may be demarcated with boundaries 822 and marked with user identifiers 824 that indicate generally the extents of the region and which user the region has been assigned to. Although the depicted extents do not overlap each other, the spatial decomposition process may result in distinct regions whose extents do overlap. An editing region may also be spatially disjoint. In some embodiments, graphical renderings within each region are color coded or coded in some other way such as a shading pattern to indicate which user they are assigned to.

In the depicted embodiment, a layer selector 812 (e.g. a drop-down list) enables a collaborative user to select the layer that is to be edited or viewed for an assigned editing region. Software tools that are specific to the selected layer (not shown) may be made available or activated on the user interface 800 in response to layer selection. Examples of such software tools include visualization tools, design tools, analysis tools, and manufacture planning tools.

The region assignment tools 830 may provide a variety of information relative to collaborative editing such as user identifiers 831, user names 832 and locations 833, a region name 834, a user priority 835, and a layer indicator 836. The user names 831 may correspond to a particular user identifier 824. The location 833 may indicate the physical location of the user and thereby enhance coordination and communication. As depicted, each of the region assignment tools 830 may have associated assignment controls, such as drop-down lists, to facilitate user selection, user assignment to editing regions, and setting of related parameters, such as the user identifier 824 and user priority 835. When a user, editing region, and related parameters have been selected, assignment may be completed by activating a control such as the assign region button 837.

The region name 834 may be derived from information within the electronic model or specified by a user upon assignment or selection. The user priority 835 may be used to determine which user a region should be assigned to if multiple users attempt to edit the same region. In one embodiment, a higher priority user can assume control of an editing region assigned to a lower priority user. The layer indicator 836 may indicate the layer in which the user is currently assigning users to editing regions.

Figure 9:
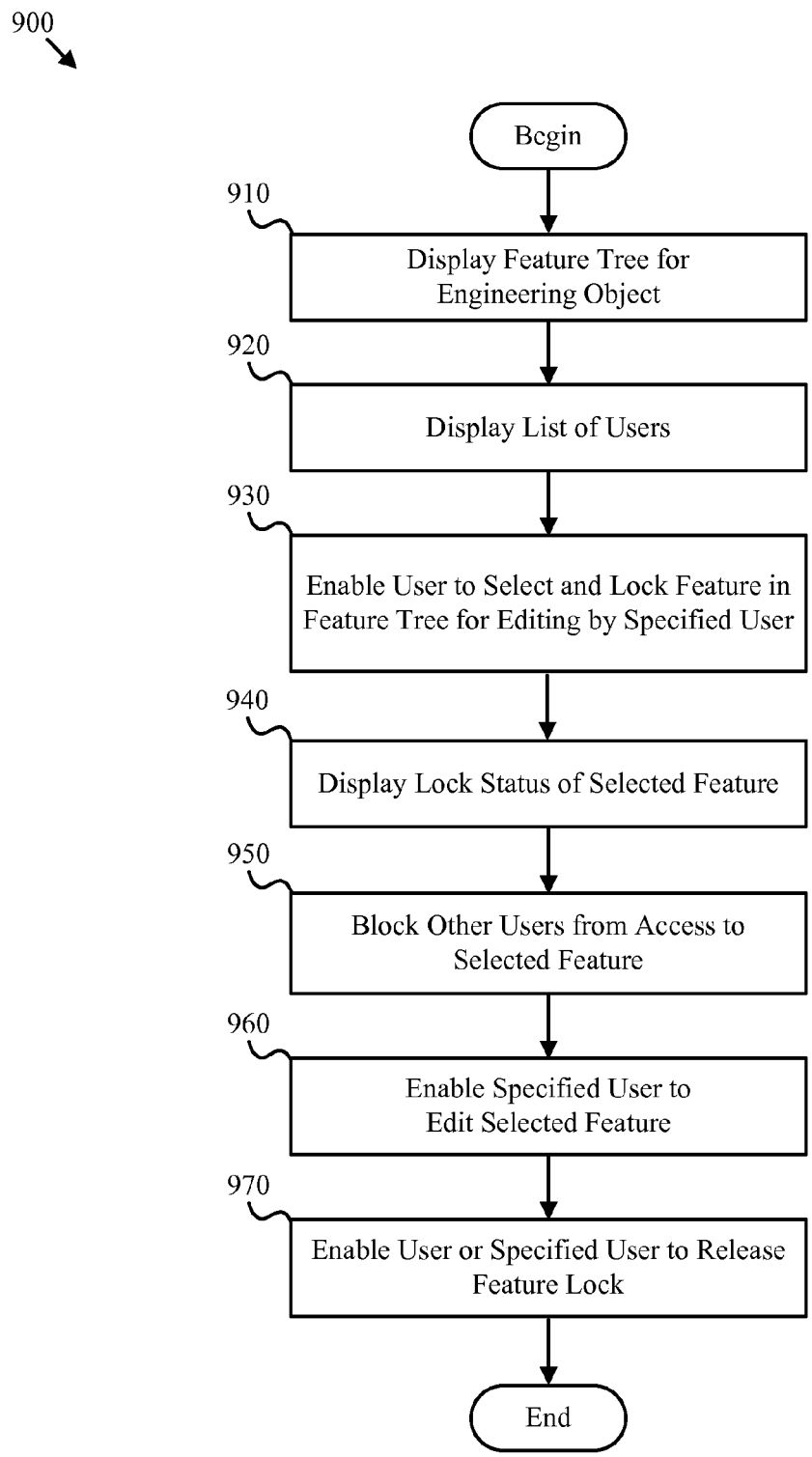
FIG. 9 is a flowchart diagram of a feature assignment method consistent with embodiments of the claimed invention.

FIG. 9 is a flowchart diagram of a feature assignment method 900. As depicted, the feature assignment method 900 includes displaying 910 a feature tree, displaying 920 a list of users, enabling 930 a user to select and lock a feature, display 940 a locked status, blocking 950 other users, enabling 960 a specified user to edit the selected feature and enabling 970 release of the feature lock. The method 900 may facilitate peer-to-peer arbitrated, or administrator controlled, multi-user CAx editing.

Displaying 910 a feature tree may include displaying a set of nodes, for example in a tree structure, that correspond to editable features of an engineering object. The feature tree may be essentially a graphically and hierarchically displayed editor that facilitates structured display and editing of geometries and associated features. Displaying 920 a list of users may include presenting a list of collaborative users that may be assigned to features. Enabling 930 a user to select and lock a feature may include specifying or assigning a user to the feature. In one embodiment, if a feature is locked for use by another user, it may be reserved for future use by the specified user.

Display 940 a locked status may include indicating on, or close to, a node corresponding to the selected feature, which user is currently assigned to the selected feature. The currently assigned user may be the specified user or a user that was previously assigned to the selected feature who has not released the selected feature for editing by others.

Blocking 950 other users may include preventing others from editing the selected feature and/or vacating changes made by other users while the feature is locked for use by the specified user. Enabling 960 the specified user may include allowing the specified user to edit the selected feature. Enabling 970 release of the feature lock may include allowing the user or the specified user to release the feature lock while blocking other users from releasing the feature lock.

Figure 10:
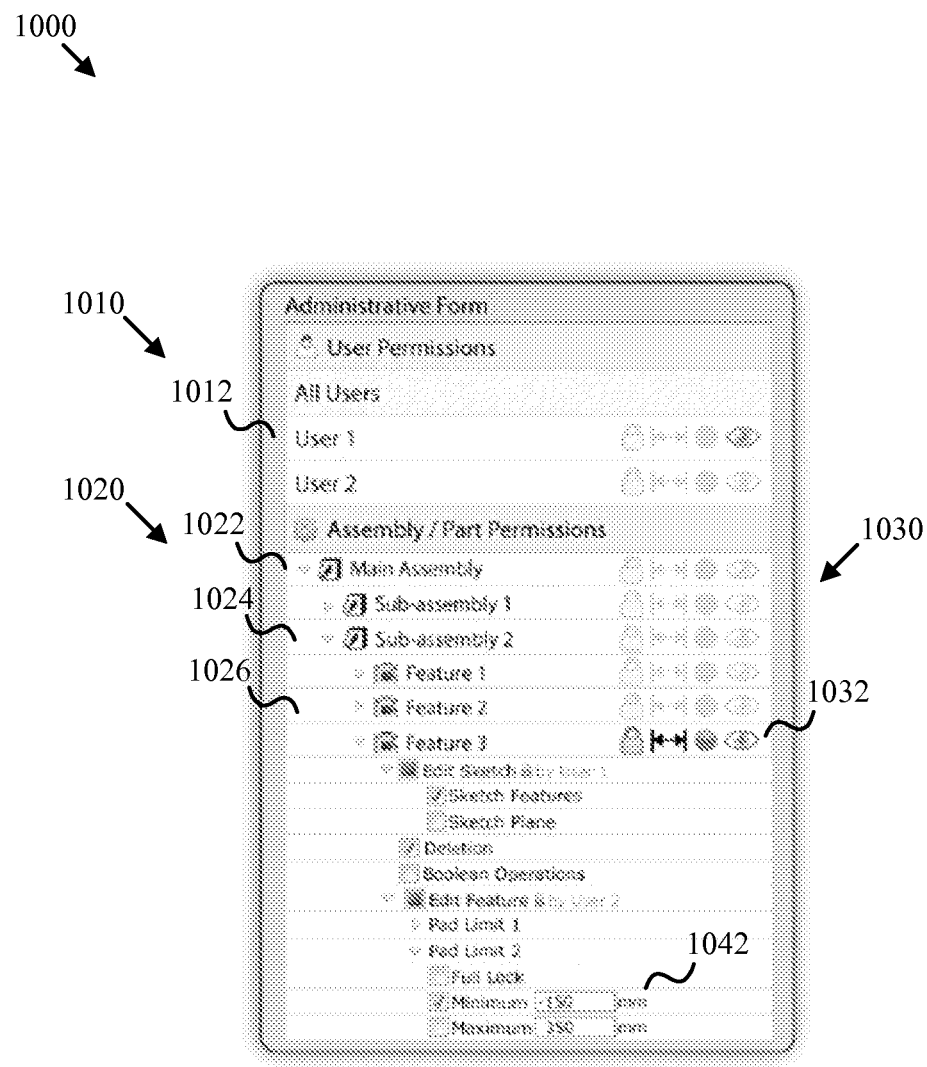
FIG. 10 is a graphical and textual depiction of one example of a feature assignment user interface that may be used in conjunction with the feature assignment method depicted in FIG. 9 and other methods describe herein.

FIG. 10 is a graphical and textual depiction of one example of a feature assignment user interface 1000 that may be used in conjunction with the feature assignment method 900 of the claimed invention. As depicted, the feature assignment user interface 1000 includes a user list 1010, an editing region feature list 1020, a feature status display 1030, and a feature editor 1040. The feature assignment user interface 1000 facilitates controlling collaborative user access and editing of features associated with editing regions in a design space for electronic models of engineering objects.

The user list 1010 may include user interface controls for identifying and selecting users 1012 to be assigned access to features associated with editing regions. Controls for displaying the user list 1010 may include scrolling lists, drop-down lists, tree view controls, hierarchical outlines, or the like.

The editing region feature list 1020 may include user interface controls for inspecting and selecting editing regions in a design space to facilitate assignment of users to editable features associated with a selected editing region. In the depicted embodiment, the editing region feature list may comprise an expanding hierarchical outline with a main assembly list 1022, a subassembly list 1024, and a feature list 1026. Relationships between main assemblies, subassemblies, and related features are represented by levels in the expanding hierarchy. Other embodiments may include drop-down lists, tree view controls, or the like.

The feature status display 1030 may include icons or other representations, such as text identifiers, indicating the status of editing regions and associated features. Status representations may indicate user access to editing regions or features, the identity of users currently assigned access or currently modifying editing regions or features, user permission to browse editing regions to which the user has not been assigned, or the like. The depicted embodiment includes status icons 1032, indicating locking, selection, and access status.

The feature editor 1040 facilitates editing of features associated with editing regions, and may include a wide range of editing tools and controls, depending on the nature of the feature data. As depicted, controls may be as simple as checkboxes and text fields. Other controls may include radio buttons, scrolling lists, drop-down lists, combo boxes, sliders, spinners, or the like. In other embodiments, the feature editing region may invoke graphical editing tools for graphically editing an editable feature, or text editing tools for creating and editing design notes associated with an editing region.

Figure 11:
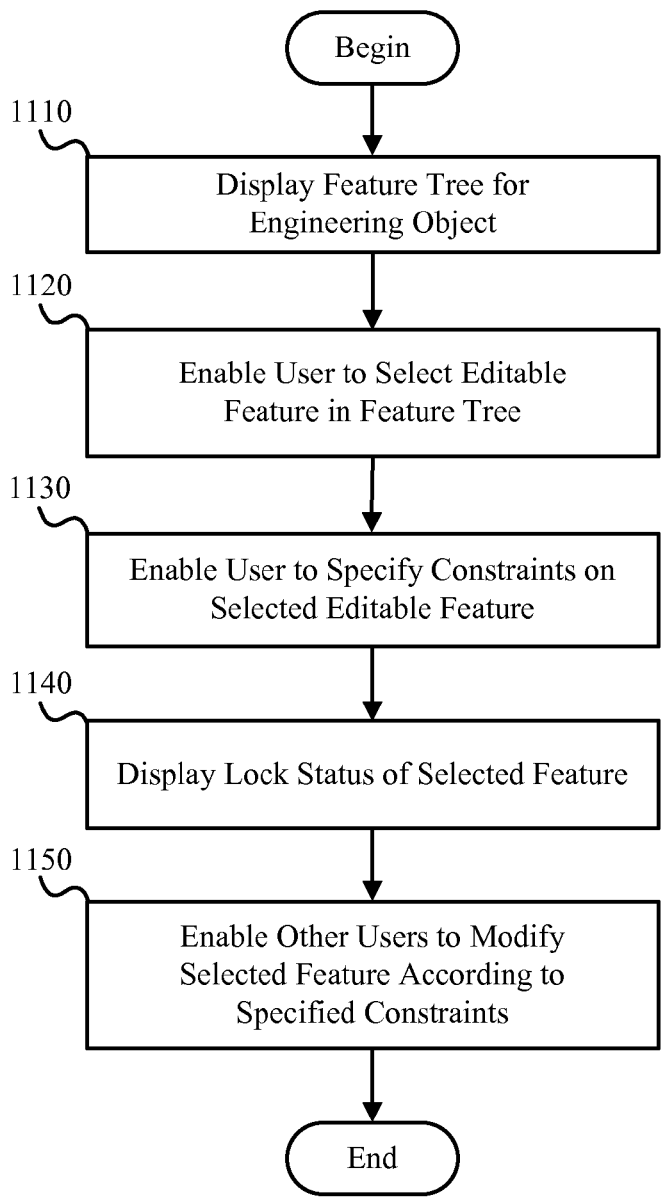
FIG. 11 is a flowchart of a feature constraint method consistent with embodiments of the claimed invention.

FIG. 11 is a flowchart of a feature constraint method 1100. As depicted, the feature constraint method 1100 includes displaying 1110 a feature tree, enabling 1120 a user to select a feature, enabling 1130 the user to specify editing constraints, displaying 1140 a locked status, enabling 1150 others to modify the constrained feature. The method 1100 may facilitate synchronous or asynchronous collaborative editing of features of an engineering object.

Displaying 1110 a feature tree may include displaying a set of nodes that correspond to editable features of an engineering object. Embodiments may vary according to the organization of the feature tree display. While the features of an engineering object decomposed into editing regions, geometries and associated features may typically be represented in a tree structure display corresponding to structures in a CAx database, one of skill in the art will recognize the advantages of various hierarchical and non-hierarchical display structures, according to the quantity and complexity of data to be displayed, data types of the editable features, and the tools that may be used to modify the editable features.

Enabling 1120 a user to select a feature may include providing user interface elements to facilitate searching or browsing the feature tree for the desired editable feature, and selecting the feature for editing. In one embodiment, the user may be presented only with editable features to which the user has been assigned. In another embodiment, selecting an editable feature initiates assignment of the selected feature to the user and locking the feature from modification by other users.

Enabling 1130 the user to specify editing constraints may include providing user interface elements for assigning and modifying constraints on an editable feature. Various user interface controls and editing tools may be selected according to the data type of the feature to be constrained.

Displaying 1140 a locked status may include displaying an icon; changing the color, shading, or background of a region of a graphical display; displaying a warning message, or the like. In one embodiment, the locked or unlocked status of features are included in the graphical or textual display of the feature data. In another embodiment, the lock status is displayed when queried by the user or when the user attempts to edit a locked feature.

Enabling 1150 others to modify the constrained feature may include providing user interface controls that limit the range or number of settings available to users. For example, radio buttons and drop-down lists limit the number of available settings a user may select. In other embodiments, enabling others to modify features according to specified constraints may include invoking data validity checking functions. Such functions may be implemented as custom-developed routines, or as functions provided by user interface development environments. For example, many database or web-based interfaces include a facility to implement data validity checking functions associated with user interface controls using Visual Basic or Javascript.

Figure 12:
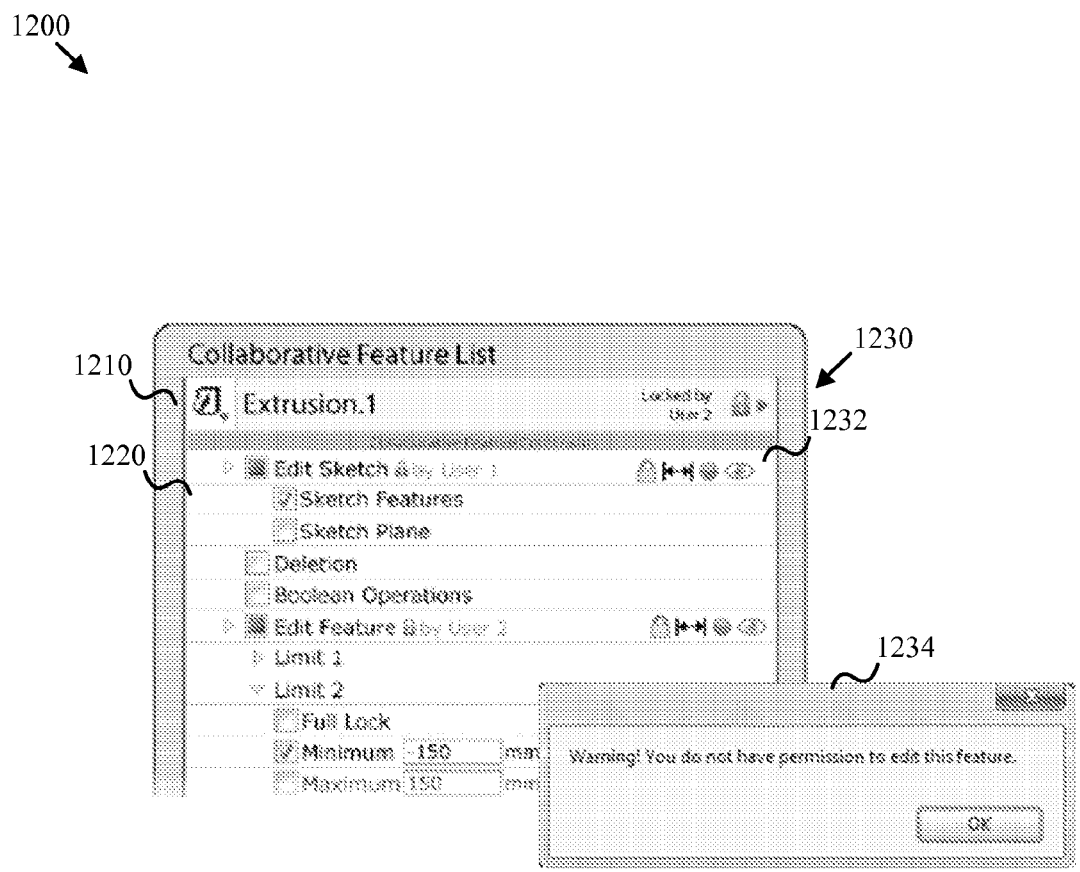
FIG. 12 is a graphical and textual depiction of one example of a collaborative feature constraint user interface that may be used in conjunction with the feature constraint method depicted in FIG. 11.

FIG. 12 is a graphical and textual depiction of one example of a collaborative feature constraint user interface 1200 that is consistent with embodiments of the claimed invention. As depicted, the collaborative feature constraint user interface 1200 includes a feature tree 1210, a feature constraint editor 1220, and a feature status display 1230. The collaborative feature constraint user interface 1200 facilitates specification of constraints on editable features for collaborative user editing of electronic models of engineering objects, and may be used in conjunction with the feature constraint method 1100.

The feature tree 1210 may include user interface controls for inspecting and selecting editable features associated with an editing region. As depicted, the feature tree may comprise a pop-up list for selecting an editing region. Other embodiments may include drop-down lists, tree view controls, or the like.

The feature constraint editor 1220 provides user interface controls for assigning and modifying constraints on an editable feature. As depicted, the feature constraint editor may comprise controls such as checkboxes and text fields. Other controls may be used as appropriate for the feature's data type, for example, radio buttons, scrolling lists, drop-down lists, combo boxes, or the like. In other embodiments, the feature constraint editor may invoke graphical editing tools for graphically specifying constraints on an editable feature.

The feature status display 1230 may include icons or other representations, such as text identifiers, indicating the status of features. Status representations may indicate user access to editable features, the identity of users currently assigned access or currently modifying editable features, user permission to browse features to which the user has not been assigned, or the like. The depicted embodiment includes status icons 1232 indicating locking, selection, and access status, and a warning dialog 1234, indicating that the user has attempted to edit a feature not assigned to the user.

Figure 13:
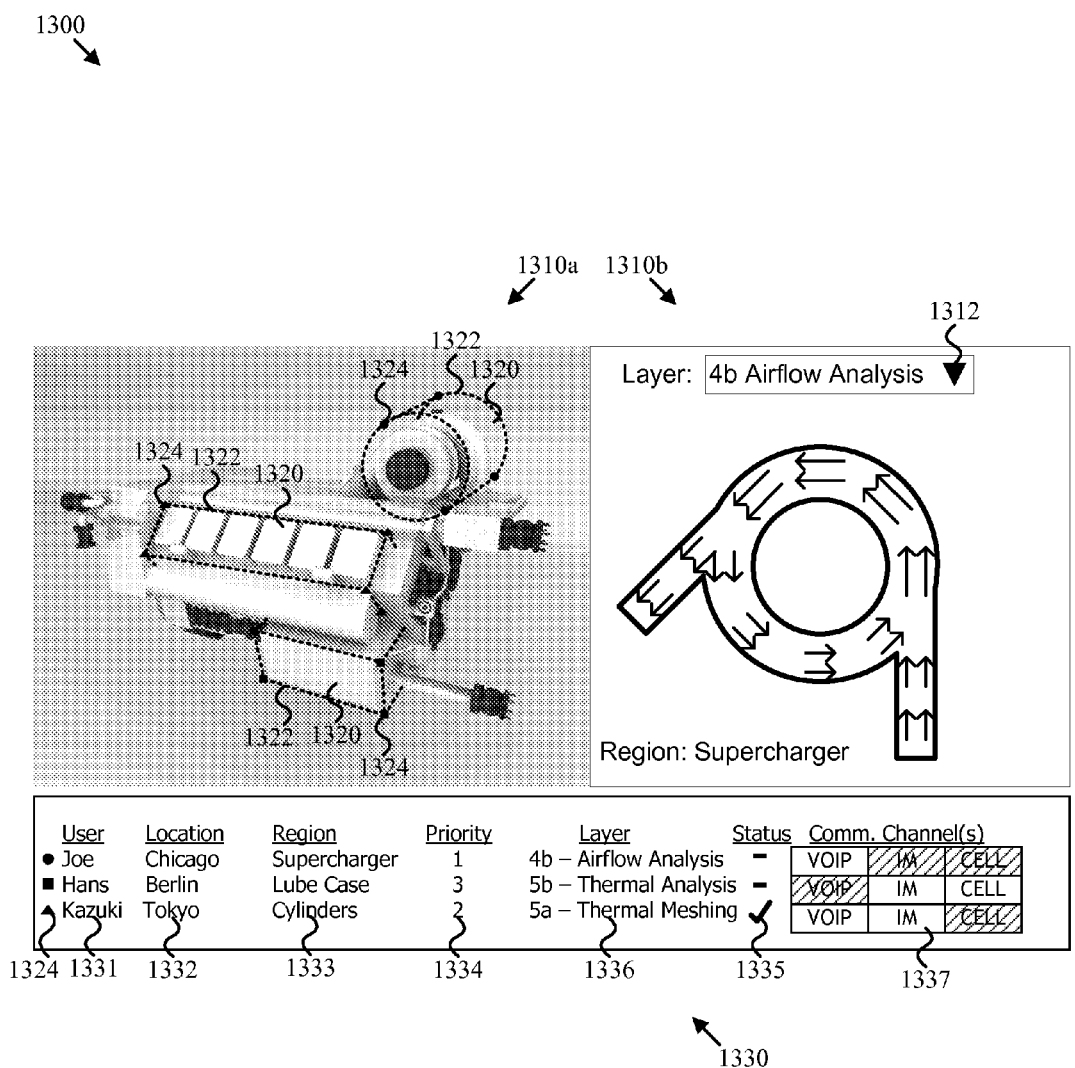
FIG. 13 is a graphical and textual depiction of one example of a collaborative CAx user interface that is consistent with one or more embodiments of the claimed invention.

FIG. 13 is a graphical and textual depiction of one example of a collaborative CAx user interface 1300 that is consistent with one or more embodiments of the claimed invention. As depicted, the user interface 1300 includes a graphical rendering 1310 with editing regions 1320 and a concurrent user list 1330. The user interface 1300 facilitates collaborative user editing of electronic models of engineering objects.

The graphical rendering 1310 provides a graphical rendering of an engineering object and/or layer associated therewith. The graphical rendering may be a 2D or 3D rendering from a variety of perspectives that facilitates editing. In the depicted embodiment, the graphical rendering includes a perspective CAD rendering 1310a and a cross-sectional analysis rendering 1310b for a region assigned to the user of the interface 1300 (i.e. 'Joe').

The editing regions 1320 may be demarcated with boundaries 1322 and marked with user identifiers 1324 that indicate generally the extents of the region and which user the region has been assigned to. In the depicted embodiment, a layer selector 1312 (e.g. a drop-down list) enables a collaborative user to select the layer that is to be edited or viewed for an assigned editing region. Software tools that are specific to the selected layer (not shown) may be made available or activated on the user interface 1300 in response to layer selection.

The concurrent user list 1330 may provide a variety of information relative to collaborative editing such as user names 1331 and locations 1332, a region name 1333, a user priority 1334, a region status 1335, a layer indicator 1336, and a channel indicator/selector 1337. The user names 1331 may correspond to a particular user identifier 1324. The location 1332 may indicate the physical location of the user and thereby enhance coordination and communication.

The region name 1333 may be derived from information within the electronic model or specified by a user upon assignment or selection. The user priority 1334 may be used to determine which user a region should be assigned to if multiple users attempt to edit the same region. In one embodiment, a higher priority user can assume control of an editing region assigned to a lower priority user. The region status 1335 may indicate the status of editing or analysis for the region such as a 'pending' indicator 1335a and a 'completed' indicator 1335b. The layer indicator 1336 may indicate the layer that the user is currently editing. The channel indicator/selector 1337 may provide a visual indication of which communication channels are available for communication with each user and enable selection of particular channels for use in communicating with one or more users.

The various interface elements of the collaborative user interface 1300 function cooperatively to facilitate productive collaborative editing of electronic models of engineering objects. The various interface elements of the collaborative user interfaces disclosed herein function cooperatively to facilitate productive collaborative editing of electronic models of engineering objects. The proceeding depiction of the collaborative user interfaces other inventive elements described herein are intended to be illustrative rather than definitive. Similarly, the claimed invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A computer-implemented method for collaborative editing of an electronic file comprising a model of an engineering object within a design space, the method comprising:
enabling a user to define a partitioning constraint for the design space;
in response to the user defining the partitioning constraint, partitioning the design space into a plurality of editing regions according to the partitioning constraint, wherein each of the plurality of editing regions is visibly defined by at least one boundary, the at least one boundary being separate from the engineering object and corresponding to the partitioning constraint;
enabling the user to reserve a selected editing region of the plurality of editing regions for editing by a specified user;
in response to the user reserving the selected editing region for editing by a specified user, identifying one or more geometries within the selected editing region;
identifying one or more features associated with the geometries within the selected editing region;
enabling the specified user to edit the features associated with, and the geometries within, the selected editing region;
visually indicating a locked status for the features associated with the selected editing region on a feature tree displayed to one or more unspecified users that are not the specified user;
blocking access from the one or more unspecified users to the features associated with, and the geometries within, the selected editing region in response to the user reserving the selected editing region for editing by the specified user.

2. The method of claim 1, wherein the partitioning constraint is a partitioning surface.

3. The method of claim 2, wherein the partitioning surface is selected from the group consisting of a planar surface, a curved surface, an open surface, a closed surface, and at least a portion of a three-dimensional shape selected from the group consisting of a block, a cylinder, a cone, a conical frustum, and an ellipsoid.

4. The method of claim 2, wherein the partitioning surface is effectively closed and thereby partitions the design space into an inside region and an outside region and wherein the selected editing region is inside of, or outside of, the partitioning surface.

5. The method of claim 1, wherein the partitioning constraint is a geometry list.

6. The method of claim 1, wherein the partitioning constraint is a feature selection filter.

7. The method of claim 1, wherein the partitioning constraint is an equation.

8. A computer-implemented method for collaborative editing of an electronic file comprising a model of an engineering object within a design space, the method comprising:
enabling a user to specify one or more selected geometries from a plurality of geometries associated with an engineering object;
enabling the user to assign the selected geometries to a specified user;
in response to the user assigning the selected geometries to the specified user, identifying one or more features associated with the selected geometries and generating at least one editing region boundary, the at least one editing region boundary being independent from, and visually corresponding to, the selected geometries assigned to the specified user;

enabling the specified user to edit the selected geometries and the features associated therewith;

visually indicating a locked status for the features associated with the selected geometries on a feature tree displayed to one or more unspecified users that are not the specified user; and blocking access from the one or more unspecified users to the selected geometries and the features associated therewith in response to the user assigning the selected geometries to the specified user.

9. The method of claim 8, wherein enabling a user to specify the selected geometries comprises presenting a list of geometries.

10. The method of claim 8, wherein enabling a user to specify the selected geometries comprises providing a selection filter interface.

11. The method of claim 8, wherein enabling a user to specify the selected geometries comprises responding to a mouse event.

12. The method of claim 8, wherein enabling a user to specify a specified user comprises presenting a list of users.

* * * * *